(12) United States Patent
Jung et al.

(10) Patent No.: US 11,075,329 B2
(45) Date of Patent: Jul. 27, 2021

(54) DISPLAY PANEL WITH LIGHT EMITTING DIODE (LED) POWER TRANSFER STRUCTURE AND DISPLAY APPARATUS INCLUDING THE SAME

(71) Applicant: SAMSUNG ELECTRONICS CO., LTD., Suwon-si (KR)

(72) Inventors: Youngki Jung, Suwon-si (KR); Sangmin Shin, Suwon-si (KR); Seongphil Cho, Suwon-si (KR); Jinho Kim, Suwon-si (KR); Dongmyung Son, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/570,041

(22) Filed: Sep. 13, 2019

(65) Prior Publication Data

US 2020/0091391 A1     Mar. 19, 2020

(30) Foreign Application Priority Data

Sep. 14, 2018   (KR) ........................ 10-2018-0110103

(51) Int. Cl.
*H01L 33/62*         (2010.01)

(52) U.S. Cl.
CPC ...... *H01L 33/62* (2013.01); *H01L 2933/0083* (2013.01)

(58) Field of Classification Search
CPC ............. H01L 33/62; H01L 2933/0083; H01L 25/167; H01L 25/0753
See application file for complete search history.

(56) References Cited

U.S. PATENT DOCUMENTS 8,599,118 B2   12/2013  Cok
9,412,772 B1    8/2016  Ghali
(Continued)

FOREIGN PATENT DOCUMENTS

JP        3228619 B2   11/2001
JP     2010-181835 A    8/2010
(Continued)

OTHER PUBLICATIONS

Written Opinion (PCT/ISA/237) issued by the International Searching Authority in corresponding International Application No. PCT/KR2019/011789, dated Dec. 23, 2019.
(Continued)

*Primary Examiner* — Kyoung Lee
*Assistant Examiner* — Christina A Sylvia
(74) *Attorney, Agent, or Firm* — Sughrue Mion, PLLC

(57) ABSTRACT

A display panel is provided. The display panel may include a plurality of light emitting diodes (LEDs); a thin film transistor (TFT) substrate configured to include a first connection pad and on which the plurality of LEDs are disposed, the plurality of LEDs being disposed in a predetermined region of an upper surface of the TFT substrate, and the first connection pad being disposed in another region of the upper surface of the TFT substrate and electrically connected to each of the plurality of LEDs; a transparent plate configured to be disposed on the TFT substrate and include a second connection pad, and a driver configured to be electrically connected to the second connection pad and be disposed in an outer region of the transparent plate.

19 Claims, 12 Drawing Sheets

(56) References Cited

U.S. PATENT DOCUMENTS

| | | |
|---|---|---|
| 9,454,036 B2 | 9/2016 | Lee et al. |
| 10,373,985 B2 * | 8/2019 | Kim .................... H01L 25/167 |
| 10,446,724 B2 * | 10/2019 | Kwon .................... H01L 27/15 |
| 2012/0206428 A1 | 8/2012 | Cok |
| 2014/0027709 A1 * | 1/2014 | Higginson .......... H01L 25/0753 |
| | | 257/13 |
| 2014/0085585 A1 * | 3/2014 | Sung .................. G02F 1/13458 |
| | | 349/143 |
| 2014/0368769 A1 | 12/2014 | Lee et al. |
| 2016/0018094 A1 | 1/2016 | Bower et al. |
| 2017/0012188 A1 | 1/2017 | Park et al. |
| 2017/0269749 A1 * | 9/2017 | Bok .................... H01L 27/3258 |
| 2018/0069072 A1 | 3/2018 | Kajiyama et al. |

FOREIGN PATENT DOCUMENTS

| | | |
|---|---|---|
| KR | 10-2014-0021558 A | 2/2014 |
| KR | 10-2014-0144828 A | 12/2014 |
| KR | 10-2017-0063306 A | 6/2017 |
| KR | 10-2018-0029845 A | 3/2018 |
| WO | 2017142817 A1 | 8/2017 |

OTHER PUBLICATIONS

International Search Report (PCT/ISA/210), issued by International Searching Authority in corresponding International Application No. PCT/KR2019/011789, dated Dec. 23, 2019.

* cited by examiner

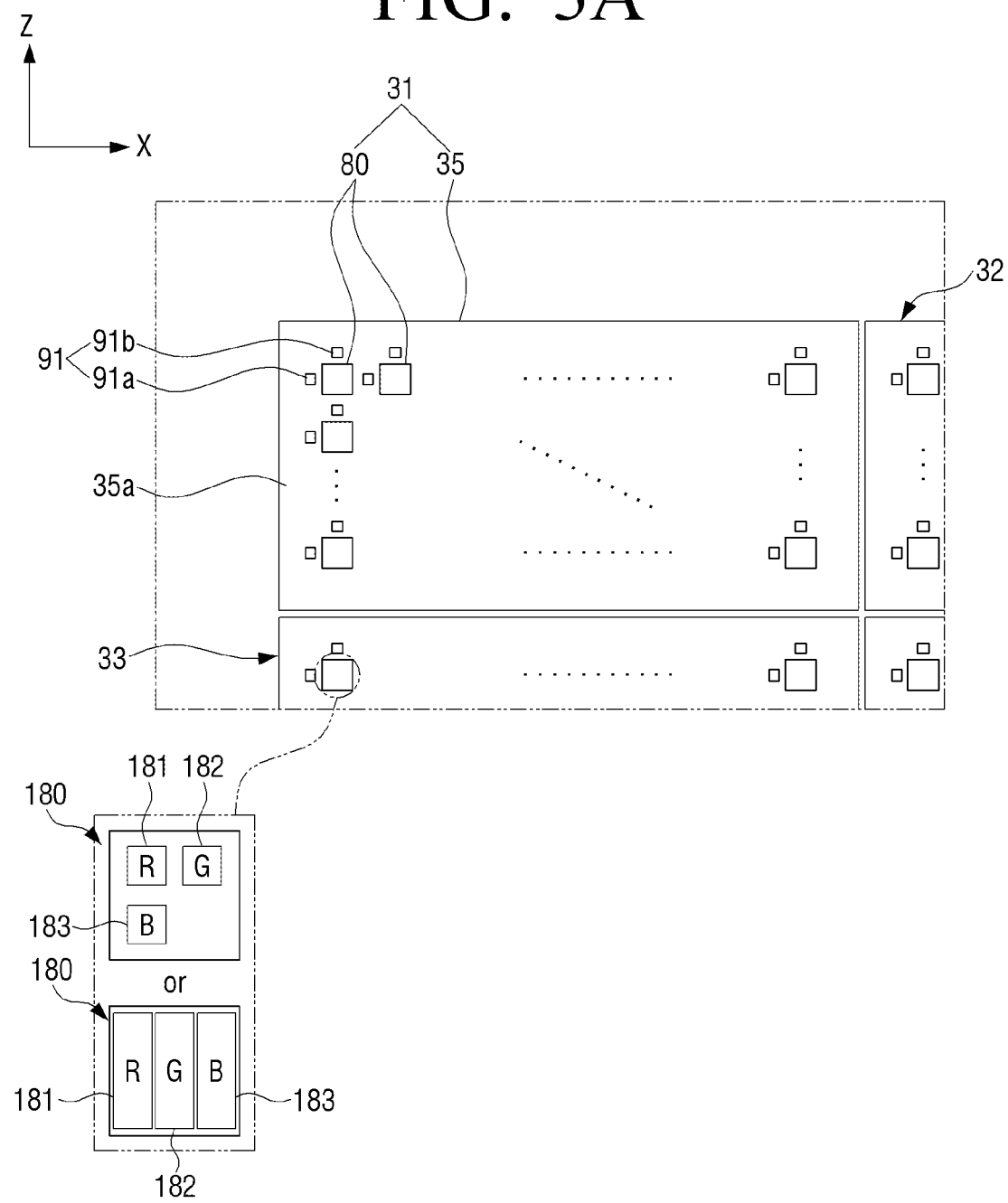

DISPLAY PANEL WITH LIGHT EMITTING DIODE (LED) POWER TRANSFER STRUCTURE AND DISPLAY APPARATUS INCLUDING THE SAME

CROSS-REFERENCE TO RELATED APPLICATION(S)

This application is based on and claims priority under 35 U.S.C. § 119 to Korean Patent Application No. 10-2018-0110103, filed on Sep. 14, 2018, in the Korean Intellectual Property Office, the disclosure of which is incorporated by reference herein in its entirety.

BACKGROUND OF THE INVENTION

Field of the Invention

The disclosure relates to a display panel which is manufactured in a simple manner and has an improved power transferring characteristic compared to the conventional technology, and a display apparatus including the same display panel.

Description of the Related Art

A micro light emitting diode (micro-LED) may include a micro-inorganic light emitting material which emits light by itself without a color filter or a backlight. Specifically, a length and an area of the micro-LED may be a first fraction (e.g., $\frac{1}{10}^{th}$) and a second fraction (e.g., $\frac{1}{100}^{th}$) of a size of a general/conventional light emitting diode (LED) chip, respectively, and may refer to a micro-sized LED of which a width, a length, and a height are smaller than the general/conventional LED chip. For example, a size of a width, a length and a height of a micro-LED may be 10 to 100 μm, respectively.

The micro-LED may implement various colors including white, through R, G, and B micro-LEDs which may emit red light, green light, and blue light, respectively.

An operation of such a micro-LED may be controlled by a pixel thin film transistor (TFT). A plurality of TFTs may be arranged on at least one of: a ductile substrate, a glass substrate, or a plastic substrate, and such a substrate on which the plurality of TFTs are arranged may be called a TFT substrate.

Furthermore, the TFT substrate may be connected to an external integrated circuit (IC) or a driver IC, which may selectively supply power to the TFT substrate, to drive the TFT substrate. At least one of the external IC or the driver IC may be disposed at various positions adjacent to the TFT substrate to easily drive the TFT substrate.

SUMMARY OF THE DISCLOSURE

Embodiments of the disclosure may overcome the above disadvantages and other disadvantages not described above. Also, the disclosure is not required to overcome the disadvantages described above, and an embodiment of the disclosure may not overcome any of the problems described above.

The disclosure provides a display panel which may be manufactured in a simple manner by disposing a driver adjacent to a thin film transistor (TFT) substrate and has an improved power transferring characteristic, and a display apparatus including the same.

According to an embodiment of the disclosure, a display panel may include: a plurality of light emitting diodes (LEDs); a TFT substrate configured to include a first connection pad and on which the plurality of LEDs are disposed, the plurality of LEDs being disposed in a predetermined region of an upper surface of the TFT substrate, and the first connection pad being disposed in another region of the upper surface of the TFT substrate and electrically connected to each of the plurality of LEDs; a transparent plate configured to be disposed on the TFT substrate and include a second connection pad, the second connection pad being disposed on a lower surface of the transparent plate and electrically connected to the first connection pad, and the lower surface of the transparent plate facing the upper surface of the TFT substrate; and a driver configured to be electrically connected to the second connection pad and be disposed in an outer region of the transparent plate.

An area of the transparent plate may be larger than an area of the TFT substrate, and the driver may be disposed on the lower surface of the transparent plate.

The number of first connection pads and the number of second connection pads may be the same as each other, and the second connection pad may be disposed at a position facing the first connection pad.

The display panel may further include: a conductive member configured to be disposed between the first connection pad and the second connection pad and electrically connect the first connection pad and the second connection pad to each other, wherein a height from the upper surface of the TFT substrate to the transparent plate may be larger than a height from the upper surface of the TFT substrate to an upper surface of each of the plurality of LEDs.

The transparent plate may further include a connection wiring electrically connecting the second connection pad and the driver to each other and formed in a matrix form. The connection wiring may be formed on the lower surface of the transparent plate.

The connection wiring may include a first connection wiring formed in a horizontal direction, and a second connection wiring formed in a vertical direction. The second connection pad may be disposed in a region in which the first connection wiring and the second connection wiring intersect with each other.

The driver may include a first driver electrically connected to the first connection wiring and disposed in a horizontal direction of the transparent plate, and a second driver electrically connected to the second connection wiring and disposed in a vertical direction of the transparent plate.

The TFT substrate may further include an additional first connection pad electrically connected to the plurality of LEDs and disposed on the upper surface of the TFT substrate. The transparent plate may further include an additional second connection pad electrically connected to the additional first connection pad and disposed on the lower surface of the transparent plate.

The number of first connection pads may be plural, and each of the plurality of first connection pads may be disposed adjacent to each of the plurality of LEDs to correspond to each of the plurality of LEDs.

According to another embodiment of the disclosure, a display apparatus may include: a plurality of display modules; a transparent plate configured to be disposed on the plurality of display modules and be electrically connected to the plurality of display modules; and a housing configured to fix the plurality of display modules and the transparent plate, wherein each of the plurality of display modules includes a TFT substrate; a plurality of LEDs disposed in a predetermined region of an upper surface of the TFT substrate; and a first connection pad disposed on the upper surface of the TFT substrate and electrically connected to the plurality of LEDs. The transparent plate may include a second connection pad disposed on a lower surface of the transparent plate and electrically connected to the first connection pad, the lower surface facing the upper surface of the TFT substrate, and a driver electrically connected to the second connection pad, disposed in an outer region of the transparent plate, and configured to drive the plurality of LEDs.

The plurality of TFT substrates may be arranged parallel to each other on the same plane. An area of the transparent plate may be larger than a sum of areas of the plurality of TFT substrates.

The plurality of TFT substrates may be arranged on the lower surface of the transparent plate.

Distances from the lower surface of the transparent plate to upper surfaces of the plurality of LEDs may be uniform.

The driver may be disposed on the lower surface of the transparent plate.

The number of first connection pads and the number of second connection pads may be the same as each other, and the second connection pad may be disposed at a position facing the first connection pad.

According to the diverse embodiments of the disclosure, the white light source and the blue light source are individually controlled so that the brightness may be improved, alteration of color caused by difference in characteristics of the light sources may be solved, and the display apparatus may operate in transparent mode.

According to another embodiment, a display panel may comprise: a plurality of light emitting diodes (LEDs); a thin film transistor (TFT) substrate comprising a first connection pad, wherein the plurality of LEDs are disposed in a first region of an upper surface of the TFT substrate. The first connection pad may be disposed in a second region of the upper surface of the TFT substrate. The first region may be different from the second region. The first connection pad may be electrically connected to each of the plurality of LEDs. The display panel may also comprise a transparent plate disposed on the TFT substrate. The transparent plate may comprise a second connection pad. The second connection pad may be disposed on a lower surface of the transparent plate and may be electrically connected to the first connection pad. The lower surface of the transparent plate may face the upper surface of the TFT substrate.

The display panel may further comprise a driver electrically connected to the second connection pad, which may be disposed in an outer edge region of the transparent plate.

The display panel may further include that a surface area of the transparent plate is larger than a surface area of the TFT substrate. In addition, the driver may be disposed on the lower surface of the transparent plate in an area that does not overlap with the surface area of the TFT substrate.

The display panel may further include that a number of first connection pads and a number of second connection pads are the same as each other, and the second connection pads may be disposed at a position facing the first connection pads.

The display panel may further comprise a conductive member disposed between each of the first connection pads and the second connection pads. The conductive member may electrically connect the first connection pad and the second connection pad to each other. A height or distance from the upper surface of the TFT substrate to the transparent plate may be larger than a height or distance from the upper surface of the TFT substrate to an upper surface of each of the plurality of LEDs.

The display panel may further include that the transparent plate further includes a connection wiring that electrically connects the second connection pad and the driver to each other. The connection wiring may be formed in a matrix form.

The connection wiring may be formed on the lower surface of the transparent plate. The connection wiring may include a first connection wiring formed in a horizontal direction, and a second connection wiring formed in a vertical direction. The second connection pad may be disposed in a region in which the first connection wiring and the second connection wiring intersect with each other.

The driver may include a first driver and a second driver. The first driver may be electrically connected to the first connection wiring and may be disposed with a length in a horizontal direction of the transparent plate. The second driver may be electrically connected to the second connection wiring and may be disposed with a length in a vertical direction of the transparent plate.

The TFT substrate may further include an additional first connection pad electrically connected to the plurality of LEDs. The additional first connection pad may be disposed on the upper surface of the TFT substrate. The transparent plate may further include an additional second connection pad electrically connected to the additional first connection pad. The additional second connection pad may be disposed on the lower surface of the transparent plate.

The number of first connection pads may be plural. Each of the plurality of first connection pads may be disposed adjacent to each of the plurality of LEDs, such that, for example, the first connection pads correspond one-to-one to each of the plurality of LEDs.

According to an embodiment, a display apparatus may comprise: a plurality of display modules, and a transparent plate disposed on the plurality of display modules and electrically connected to the plurality of display modules. The display apparatus may further comprise a housing configured to fix the plurality of display modules and the transparent plate to each other. Each of the plurality of display modules may include a thin film transistor (TFT) substrate, a plurality of LEDs disposed in a region of an upper surface of the TFT substrate, and a first connection pad disposed on the upper surface of the TFT substrate and electrically connected to the plurality of LEDs.

The transparent plate may include a second connection pad disposed on a lower surface of the transparent plate and electrically connected to the first connection pad. The lower surface of the transparent plate may face the upper surface of the TFT substrate. The display apparatus may further comprise a driver electrically connected to the second connection pad. The driver may be disposed in an outer region of the transparent plate, and may be configured to drive the plurality of LEDs.

The TFT substrate may include a plurality of TFT substrates, which may be arranged parallel to each other on the same plane. An area of the transparent plate may be larger than a sum of areas of the plurality of TFT substrates. The plurality of TFT substrates may be arranged on the lower surface of the transparent plate. Distances from the lower surface of the transparent plate to upper surfaces of the plurality of LEDs may be uniform.

The driver may be disposed on the lower surface of the transparent plate.

The number of first connection pads and the number of second connection pads may be the same as each other, and the second connection pad may be disposed at a position facing the first connection pad.

According to an embodiment, a display panel may comprise: a plurality of micro-light emitting diodes (LEDs); and a thin film transistor (TFT) substrate, wherein the plurality of micro-LEDs are disposed on an upper surface of the TFT substrate. The display panel may further comprise a transparent plate disposed on the TFT substrate. The lower surface of the transparent plate may face the upper surface of the TFT substrate.

The display panel may further comprise a driver electrically connected to the micro-LEDs. The driver may be disposed in an outer region of the transparent plate. The outer region (driver) may be adjacent to a thin film transistor (TFT).

The display panel may further comprise a connection wiring that connects the driver to the plurality of micro-LEDs and transmits a signal which causes the plurality of micro-LEDs to illuminate.

The connection wiring may be at least one of: formed of a transparent material that does not block light emitted from the plurality of micro-LEDs, or has a thickness or diameter that is small enough to not block the light emitted from the plurality of micro-LEDs.

The display panel may further comprise one or more connections pads formed on the upper surface of the TFT substrate adjacent to the plurality of micro-LEDs to correspond to the plurality of micro-LEDs.

The respective micro-LEDs may be electrically connected to first and second drivers through first and second connection pads, and first and second connection wirings. The first and second connection wirings may intersect.

Additional and/or other aspects and advantages of the disclosure will be set forth in part in the description which follows and, in part, will be obvious from the description, or may be learned by practice of the disclosure.

BRIEF DESCRIPTION OF THE DRAWINGS

The above and/or other embodiments of the disclosure will be more apparent by describing certain embodiments of the disclosure with reference to the accompanying drawings, in which:

FIG. 3A shows an enlarged view illustrating region A of FIG. 2, in which the transparent plate is omitted;

DETAILED DESCRIPTION OF THE EXEMPLARY EMBODIMENTS

To sufficiently understand configurations and effects of the disclosure, embodiments of the disclosure will be described with reference to the accompanying drawings. However, the disclosure is not limited to embodiments to be described below, but may be implemented in several forms and may be variously modified. A description for these embodiments will be provided only to make the disclosure complete and allow those skilled in the art to which the disclosure pertains to completely recognize the scope of the disclosure. In the accompanying drawings, sizes of components may be enlarged or reduced as compared with actual sizes for convenience of explanation, and ratios of the respective components may be exaggerated or reduced.

It is to be understood that when one component is referred to as being "disposed on" or "in contact with" another component, it may be in direct contact with or connected directly to another component, or connected to another component with the other component interposed therebetween. On the other hand, it is to be understood that when one component is referred to as being "disposed directly on" or "in direct contact with" another component, it may be connected to another component without the other component (or any other component) interposed therebetween. Other expressions describing a relationship between components, for example, "between", "directly between", and the like, should be similarly interpreted.

Terms such as 'first', 'second', and the like, may be used to describe various components, but the components are not to be interpreted to be limited to the terms. These terms may be used to differentiate one component from other components. However, a "first" component may be named a "second" component and the "second" component may also be similarly named the "first" component, without departing from the scope of the disclosure.

Singular forms are intended to include plural forms unless the context clearly indicates otherwise. It may be interpreted that terms "include", "have", or the like, specify the presence of features, numerals, steps, operations, components, parts mentioned in the specification, or a combination thereof, but do not preclude the addition of one or more other features, numerals, steps, operations, components, parts, or a combination thereof.

Terms used in embodiments of the disclosure may be interpreted as the same meanings as meanings that are generally known to those skilled in the art unless defined otherwise.

Hereinafter, a structure of a display apparatus 1 according to the disclosure will be described with reference to FIG. 1.

Figure 1:
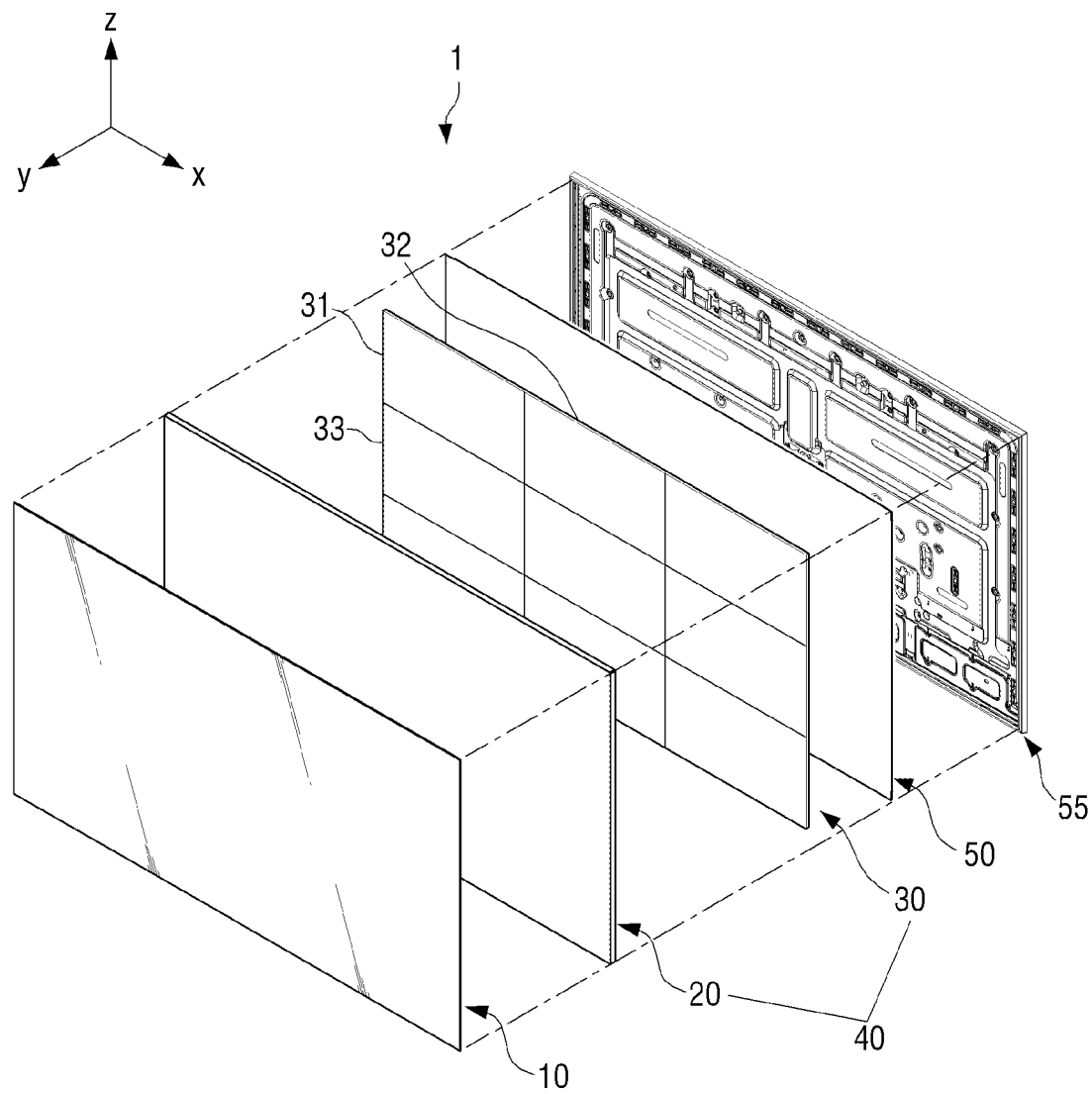
FIG. 1 shows an exploded perspective view of a display apparatus according to an embodiment of the disclosure.

FIG. 1 shows an exploded perspective view of the display apparatus 1 according to an embodiment of the disclosure.

The display apparatus 1 described below is an apparatus which may process an image signal obtained from the outside and visually display a processed image. The display apparatus 1 may be implemented in various forms such as at least one of: a television (TV), a monitor, a mobile multimedia device, a mobile communication device, or the like, but the form of the display apparatus 1 is not limited as long as can visually display an image.

As illustrated in FIG. 1, the display apparatus 1 may include a protection sheet 10, a display panel 40 which may include a transparent plate 20 and a plurality of display modules 30, an arrangement plate 50, and a housing 55.

The protection sheet 10 may be disposed in the front (in a Y-axis direction) of the display apparatus 1, and protect the plurality of display modules 30 disposed behind the protection sheet 10 from the outside.

The protection sheet 10 may be formed of a glass material, which may have a small thickness, and may be formed of various materials as necessary.

The display panel 40 may implement an image (i.e., display an image) according to an image signal input obtained (e.g., from the outside), and may include the transparent plate 20 and the plurality of display modules 30. The transparent plate 20 may be disposed in front of the plurality of display modules 30. The plurality of display modules 30 may be electrically connected to the transparent plate 20.

Figure 6:
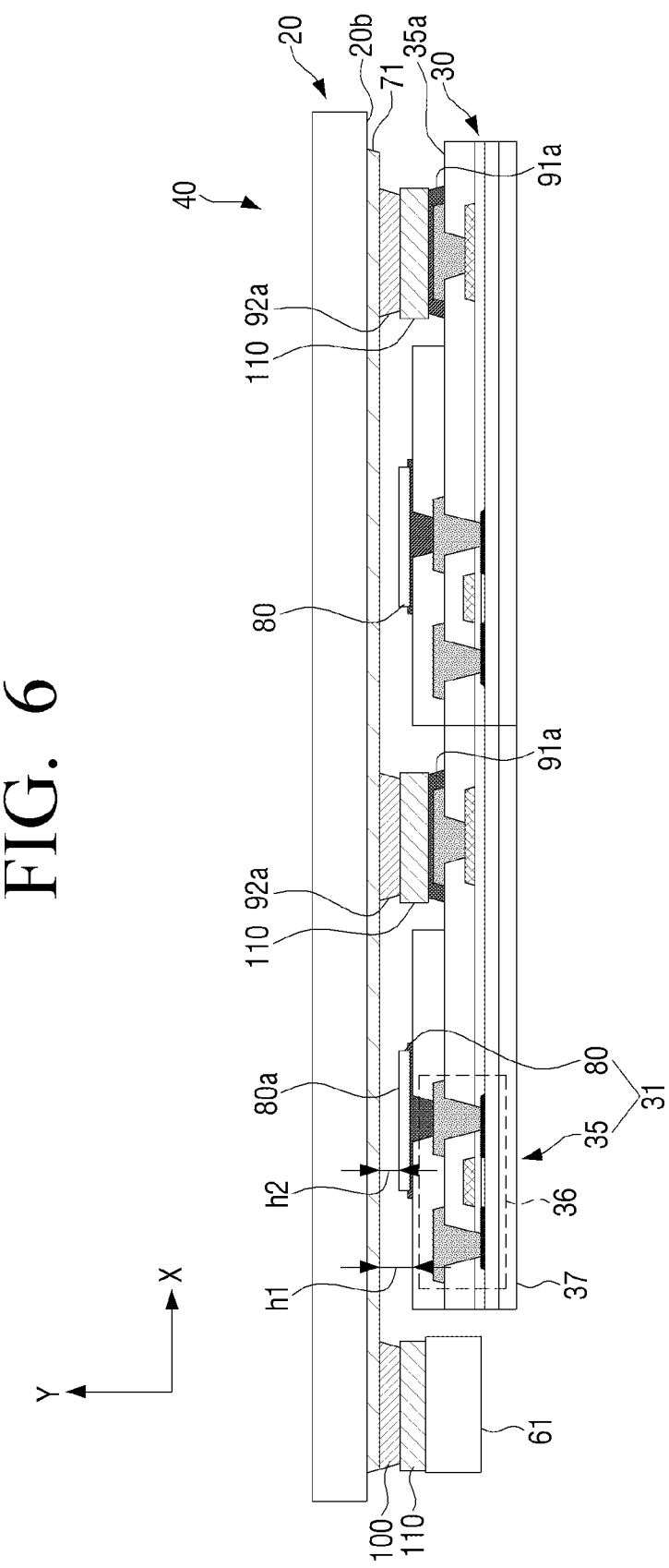
FIG. 6 shows a cross-sectional view taken along line B-B of FIG. 3B.

Here, a size of the display panel 40 may vary depending on a size of the transparent plate 20, and may also vary based on one or more of a size, a shape, or the number of the plurality of display modules 30 disposed on a lower surface 20b of the transparent plate 20 (see FIG. 6).

The display module 30 is a unit which may implement an image (e.g., display an image), and may include a thin film transistor (TFT) substrate 35, and a plurality of micro-LEDs 80 disposed on the TFT substrate 35.

The plurality of display modules 30 may implement light to display an image in a front direction (Y-axis direction) according to an image signal obtained (e.g., input from the outside).

Moreover, the plurality of display modules 30 may configure a display screen in a manner in which the respective display modules 30 manufactured as modules are arranged to fit a size of a display to be implemented.

For example, in a case where a first display module 31 and a second display module 32 are arranged side by side in a horizontal direction (X-axis direction), the display screen may be longer in the horizon direction (X-axis direction) than in a vertical direction (Z-axis direction).

Further, in a case where the first display module 31 and a third display module 33 are arranged side by side in the vertical direction (Z-axis direction), the display screen may be longer in the vertical direction (Z-axis direction) than in a vertical direction (X-axis direction).

Therefore, it is possible to implement various sizes and shapes of display screens according to the number of the plurality of arranged display modules 30 and a form in which the plurality of display modules 30 are arranged.

The TFT substrate 35 and the plurality of micro-LEDs 80 will be described in detail later with reference to FIGS. 3A to 4C.

The transparent plate 20 may be disposed on an upper portion (Y-axis direction in FIG. 1) of the plurality of display modules 30 to support the plurality of display modules 30.

The arrangement plate 50, which is a plate on which the plurality of display modules 30 may be disposed, like the transparent plate 20, may be disposed behind the plurality of display modules 30.

The arrangement plate 50 may be formed in a form of a flat plate, and may be formed in various shapes and sizes according to at least one of: the shape or the size of the plurality of display modules 30.

Accordingly, the arrangement plate 50 may support the plurality of display modules 30 together with the transparent plate 20 to make the plurality of display modules 30 be disposed next to (e.g., parallel to) each other on the same plane, and may allow the display modules 30 to be disposed at the same height, thereby making it possible to implement uniform brightness of the display screen.

However, in a case where the plurality of display modules 30 are fixed only to the transparent plate 20, the display apparatus 1 may not include the arrangement plate 50.

The housing 55 may form an appearance of the display apparatus 1, be disposed behind the plurality of display modules 30 and the arrangement plate 50, and stably fix the plurality of display modules 30 and the arrangement plate 50.

Further, the housing 55 may stably fix an edge region of the protection sheet 10.

Therefore, the housing 55 may prevent various components included in the display apparatus 1 from being damage, such as, by being exposed to the outside, and protect the various components included in the display apparatus 1 from an external impact, which could cause damage.

Hereinafter, the display panel 40 of an embodiment including the transparent plate 20 and the plurality of display modules 30 will be described in detail with reference to FIGS. 2 to 3B.

Figure 2:
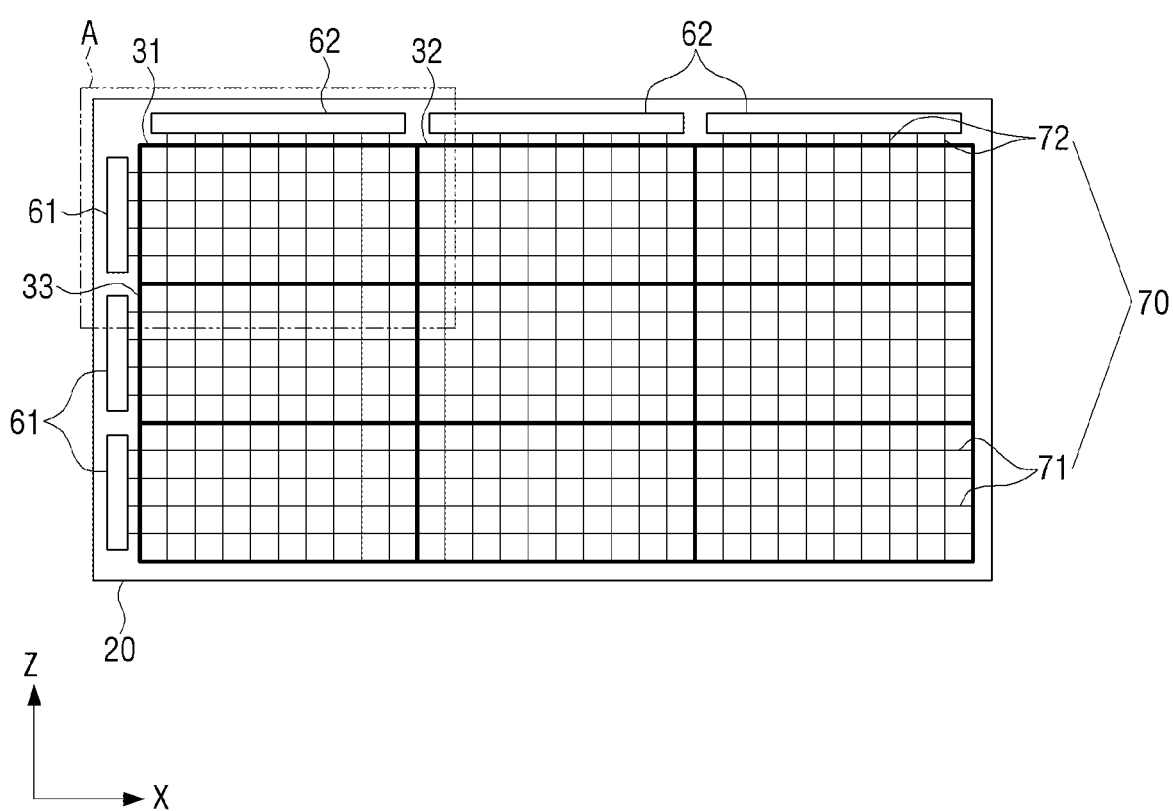
FIG. 2 shows a top view illustrating a state in which a transparent plate and a plurality of display modules are coupled to each other.
Figure 3B:
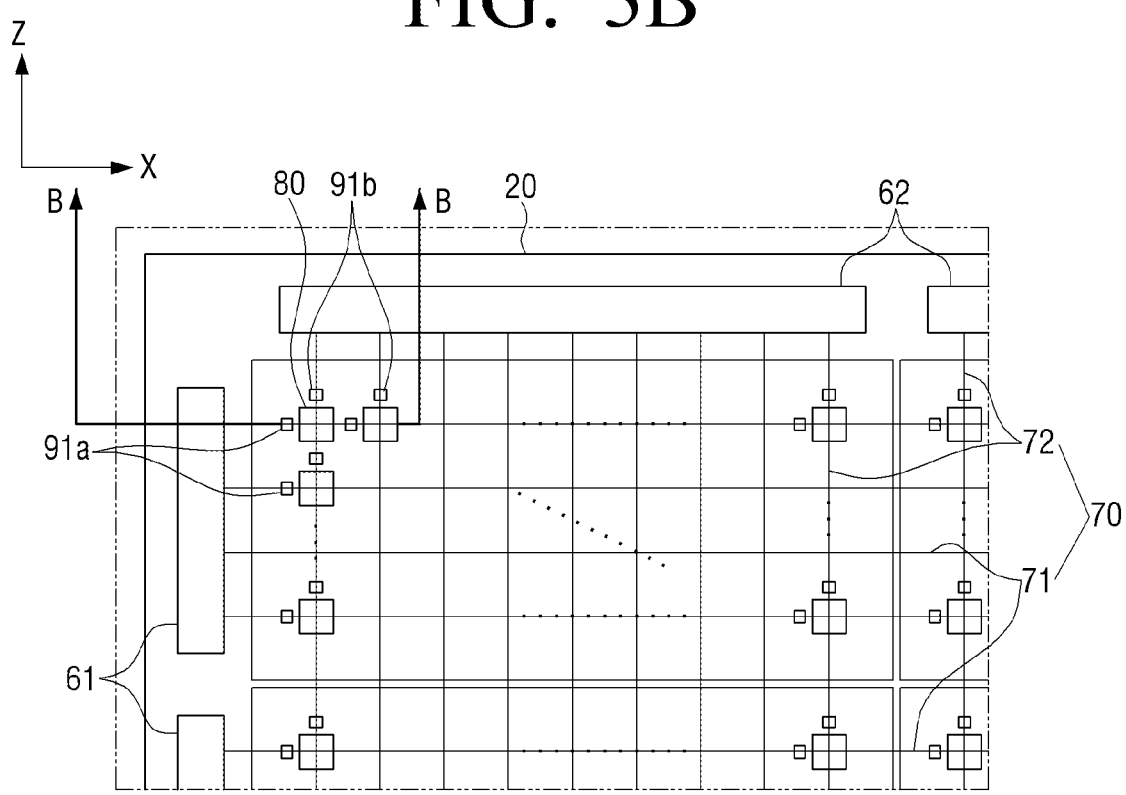
FIG. 3B shows an enlarged view illustrating the region A of FIG. 2.

FIG. 2 shows a top view illustrating a state in which the transparent plate 20 and the plurality of display modules 30 are coupled to each other, FIG. 3A shows an enlarged view illustrating region A of FIG. 2, in which the transparent plate 20 is omitted, and FIG. 3B shows an enlarged view illustrating the region A of FIG. 2.

Referring to FIG. 2, the transparent plate 20 may be disposed on the plurality of display modules 30 (e.g., display modules 31, 32 and 33) to fix the plurality of display modules 30 in place. The plurality of display modules 30 may be arranged in a predetermined form.

The transparent plate 20 may be formed of a transparent material through which light emitted from the plurality of micro-LEDs 80 may be transmitted. The plurality of micro-LEDs 80 may be disposed behind the transparent plate 20.

For example, the transparent plate 20 may be a glass substrate or a plastic plate, which may have a transmittance of about 50% or more.

Further, the transparent plate 20 may include a second connection pad 92 (92a) disposed on the lower surface 20b (see FIG. 6) of the transparent plate 20, which may be electrically connected to a first connection pad 91 (91a) via the second connection pad 92a. The lower surface 20b may face an upper surface 35a of the TFT substrate 35.

Referring to FIG. 6, the second connection pad 92 (92a) may be disposed at a position facing the first connection pad 91 (91a), respectively, and the number of second connection pads 92 may be the same as the number of the first connection pads 91.

That is, in a case where a first number of first connection pads 91 are disposed, the same number of second connection pads 92 may be disposed. That is, the first number of first connection pads 91 may be disposed, and the first connection pads 91 may be in a one-to-one correspondence with the second connection pads 92.

Accordingly, the second connection pad 92 (92a) may be electrically connected to a first connection wiring 71 and a second connection wiring 72 to be electrically connected to a driver 60 (e.g., driver 61, driver 62). See, e.g., FIG. 4C.

Therefore, the second connection pad 92 may transfer, to the first connection pad 91, an image signal transferred from one of the drivers 60 (e.g., 61, 62).

Further, an area of the transparent plate 20 may be larger than that of the TFT substrate 35 connected to the lower surface 20b of the transparent plate 20.

In addition, the transparent plate 20 may include a driver 60 (e.g., driver 61, driver 62) electrically connected to the second connection pad 92 that may drive the plurality of micro-LEDs 80, such as, by supplying power to the plurality of micro-LEDs.

The drivers 60 (e.g., driver 61, driver 62) may be disposed in an outer region of the lower surface 20b of the transparent plate 20.

Therefore, light emitted from the plurality of micro-LEDs 80 is not blocked by the driver 60, and at the same time, it is possible to reduce a total thickness of the transparent plate 20 and the display module 30.

As a result, it is possible to implement a slim structure of the display apparatus 1 including the transparent plate 20 and the display modules 30.

The driver 60 may include at least one of: a first driver 61, which may be disposed in an edge region of the transparent plate 20 in the horizontal direction (X-axis direction), or a second driver 62, which may be disposed in an edge region of the transparent plate 20 in the vertical direction (Z-axis direction). The driver(s) 60 may include both the first driver 61 and the second driver 62.

Further, the driver(s) 60 may be configured by one or more flexible printed circuit(s).

The first driver 61 may be electrically connected to the first connection wiring 71 formed in the horizontal direction (X-axis direction), and may transmit a control signal for controlling (e.g., sequentially controlling) horizontal lines (e.g., one by one) for each image frame to a pixel driving circuit 84 (see FIG. 5) connected to each line.

The second driver 62 may be electrically connected to the second connection wiring 72 formed in the vertical direction (Z-axis direction), and may transmit a control signal for controlling (e.g., sequentially controlling) vertical lines (e.g., one by one) for each image frame to the pixel driving circuit 84 connected to each line.

Further, as illustrated in FIGS. 2 and 6, a connection wiring 70 (71), which may electrically connect the second connection pad 92 and the driver 60 to each other and which may be formed in a matrix form, may be provided on the lower surface 20b of the transparent plate 20.

Specifically, the connection wiring 70 (71) may connect the plurality of second connection pads 92 (92a) to each other, connect driver connection pads 100 to each other, and connect the plurality of second connection pads 92 (92a) and the driver connection pads 100 to each other.

The connection wiring 70 may be formed on the lower surface 20b of the transparent plate 20, and include at least one of: a first connection wiring 71 formed in the horizontal direction (X-direction in FIG. 6), and a second connection wiring 72 formed in the vertical direction (Y-direction in FIG. 6). The connection wiring 70 may include both the first connection wiring 71 and the second connection wiring 72.

Therefore, in the connection wiring 70, the first connection wiring 71 in the horizontal direction and the second connection wiring 72 in the vertical direction may intersect with each other.

However, the first connection wiring 71 may transfer a first signal transferred from the first driver 61, while the second connection wiring 72 may transfer a second signal transferred from the second driver 62. The first and second connection wirings 71 and 72 may be electrically separate from each other, and thus the respective signals may not be mixed with each other.

For example, insulating materials may be formed outside at least one of the first connection wiring 71 or the second connection wiring 72, respectively, and/or the first connection wiring 71 and the second connection wiring 72 may be spatially spaced apart from each other in the transparent plate 20. However, the insulating materials may be formed outside both of the first connection wiring 71 and the second connection wiring 72.

Furthermore, the connection wiring 70 may at least one of: be formed of a transparent material so as not to block light emitted from the plurality of micro-LEDs 80, or have a thickness or diameter small enough not to block the light.

Accordingly, the transparent plate 20 may be electrically connected to the plurality of display modules 30 through the first and second connection pads 91 and 92, and the connection wiring 70 (e.g., first connection wiring 71 and second connection wiring 72), and may connect the second connection pad 92 and the driver 60 to each other through the connection wiring 70.

That is, the transparent plate 20 may connect the plurality of micro-LEDs 80 and the driver 60 which may drive the plurality of micro-LEDs 80 to each other.

Therefore, the number of drivers electrically connected to the plurality of display modules 30 through the connection wiring 70 need not be the same as the number of the plurality of arranged display modules 30, and may be smaller than the number of the plurality of arranged display modules 30 according to a signal processing capability of the driver 60.

Accordingly, it is possible to decrease the number of drivers 60, such that the number of processes of bonding the driver 60 to the transparent plate 20 may be decreased to reduce manufacturing costs and simplify a manufacturing process.

Further, even in a case where a plurality of TFT substrates are arranged on the lower surface 20b of the transparent plate 20, the area of the transparent plate 20 may be larger than a sum of areas of the plurality of TFT substrates.

Therefore, even when the driver 60 is disposed in the outer region of the lower surface 20b of the transparent plate 20, light emitted from the plurality of micro-LEDs 80 may not be blocked by the driver 60.

Further, the plurality of display modules 30 may be arranged on the lower surface 20b of the transparent plate 20, and the transparent plate 20 may support the plurality of display modules 30.

Specifically, the plurality of TFT substrates may be arranged on the lower surface 20b of the transparent plate 20.

As such, the transparent plate 20 may connect the plurality of micro-LEDs 80 and the driver 60, which drive the plurality of micro-LEDs 80, to each other, and at the same time, may support the plurality of display modules 30. Thus, the display apparatus 1 may not require any separate configuration for arranging the plurality of display modules 30.

As a result, the number of components and structures for arranging the plurality of display modules 30 may be decreased to thereby reduce the manufacturing costs.

Furthermore, the plurality of TFT substrates may be arranged on the same plane, and distances from the lower surface 20b of the transparent plate 20 to upper surfaces 80a of the plurality of micro-LEDs 80 may be uniform.

In this case, distances by which light emitted from the plurality of micro-LEDs 80 travels may be the same as each other, because the plurality of micro-LEDs 80 are separated from the lower surface 20b of the transparent plate 20 by the uniform distances, thereby making it possible to implement uniform brightness of the display apparatus 1.

Further, a black matrix (not illustrated) may be disposed on the lower surface 20b of the transparent plate 20. The black matrix may be formed of a resin composition containing a black pigment for shielding, give an interval between the plurality of micro-LEDs 80, which emit different colors of light, to prevent the respective colors from being mixed with each other, and to absorb external light to increase a contrast ratio.

Further, referring to FIG. 3A, each of the plurality of display modules 30 may include a plurality of micro-LEDs 80 and the TFT substrate on which the plurality of micro-LEDs 80 are arranged in a matrix form.

Here, the plurality of TFT substrates may have the same shape and structure as illustrated in FIGS. 1 to 4C, and one TFT substrate 35 will be described for convenience of explanation.

The micro-LED 80 may be formed of an inorganic light emitting material having at least one of a width, a length or a height that is smaller than a conventional/general LED (e.g., a width, a length, and a height of 100 μm or less, respectively), and may be disposed on the TFT substrate 35 and emit light by itself.

The micro-LED 80 may be configured by one pixel 180 (see FIG. 3A). In the one pixel, one or more of: a red micro-LED 181 which emits red light, a green micro-LED 182 which emits green light, and a blue micro-LED 183 which emits blue light may be disposed. The red micro-LED 181, the green micro-LED 182, and the blue micro-LED 183 may be sub-pixels.

As shown in FIG. 3A, the sub-pixels 181, 182, and 183 may be arranged in a matrix form or sequentially arranged in the one pixel 180. However, such an arrangement form of the sub-pixels is only an example, and the sub-pixels 181, 182, and 183 may be arranged in various forms in each single pixel 180.

In addition, one micro-LED 80 is not limited to be configured by one pixel 180, but may mean one sub-pixel 181, 182, or 183 as needed.

The micro-LED 80 may have a high response speed, a low power consumption, and a high brightness. Specifically, the micro-LED 80 may convert electricity into photons more efficiently than an existing liquid crystal display (LCD) or an organic light emitting diode (OLED).

In other words, a "brightness per watt" of the micro-LED 80 is higher than that of the existing LCD or OLED display. Therefore, the micro-LED 80 may have the same brightness with only about a half of an amount of energy consumption, in comparison to the existing LED or OLED.

In addition, the micro-LED 80 may achieve a high resolution and excellently express color tones, light and shape, and brightness to accurately express color tones in a wide range, thereby making it possible to implement a clear screen, for example, a clear screen even in the outdoors where sunlight is bright. Further, the micro-LED 80 may be resistant to a burn-in phenomenon and may rarely generate heat, and thus may have a long life without deformation.

Although a flip-chip micro-LED 80 is illustrated, a lateral type chip micro-LED or a vertical type chip micro-LED 80 may be used as needed.

Referring to FIG. 6, the TFT substrate 35 may have a structure in which a plurality of layers are stacked and pixel or sub-pixel thin film transistors (TFTs) 36 are embedded in a part of the plurality of layers and coupled to a fixing substrate 37.

The fixing substrate 37 may be a ductile substrate, a glass substrate, or a plastic substrate.

Accordingly, the micro-LEDs 80 (80a) may be disposed on the TFTs 36 (see FIG. 6) of the TFT substrate 35, respectively, and be driven by obtaining a signal through the TFTs 36.

Referring back to FIGS. 2 and 3A, the TFT substrate 35 may include the first connection pad 91 (91a) electrically connected to the TFT 36 and formed on the upper surface 35a of the TFT substrate 35.

The first connection pad 91 (91a) may be electrically connected to the second connection pad 92 (92a) described below and may transfer, to the TFT 36, an image signal transferred from the driver 60 (e.g., the first driver 61 or the second driver 62).

Furthermore, the number of first connection pads 91 (91a) may be plural, and the first connection pads 91 may be formed on the upper surface of the TFT substrate 35. In addition, the first connection pads 91 (91a) may be disposed adjacent to the plurality of micro-LEDs 80 to correspond to the plurality of micro-LEDs 80, respectively.

Accordingly, the first connection pad 91 may rapidly transfer, to the micro-LED 80, the image signal transferred to the first connection pad 91 without any loss, because of the structure in which the first connection pad 91 is disposed adjacent to the micro-LED 80.

The first connection pad 91 may include a horizontal-first connection pad 91a disposed in a horizontal axis direction (X-axis direction) based on the micro-LED 80, and a vertical-first connection pad 91b disposed in a vertical axis direction (Z-axis direction) based on the micro-LED 80 (see FIGS. 3A and 3B).

The horizontal-first connection pad 91a may be in contact with a horizontal-second connection pad 92a electrically connected to the horizontal-first connection pad 91a to transfer a signal transferred from the first driver 61 to the adjacent micro-LED 80.

Similarly, the vertical-first connection pad 91b may be in contact with a vertical-second connection pad 92b electrically connected to the vertical-first connection pad 91b to transfer a signal transferred from the second driver 62 to the adjacent micro-LED 80.

Accordingly, the micro-LED 80 may control a color, a brightness, ON/OFF, and the like thereof according to the signal transferred from each of the first and second drivers 61 and 62.

As illustrated in FIG. 3A, the display modules 32 and 33 having the same configuration as that of the display module 31 including the TFT substrate 35 having the upper surface 35a on which the plurality of micro-LEDs 80 may be disposed may be arranged at uniform intervals.

Then, as illustrated in FIG. 3B, the transparent plate 20 may be disposed on the plurality of arranged display modules (e.g., display modules 31, 32, and 33), and the first connection pad 91 of the TFT substrate included in each of the plurality of display modules (e.g., display modules 31, 32, and 33), and the second connection pad 92 formed on the lower surface 20b of the transparent plate 20 may be connected to each other.

Accordingly, the respective micro-LEDs 80 may be electrically connected to the first and second drivers 61 and 62 through the first and second connection pads 91 and 92, and the first and second connection wirings 71 and 72.

Therefore, the micro-LED 80 may be operated according to an image signal or a control signal transferred from at least one of the first driver 61 or the second driver 62. The micro-LED 80 may be both operated according to a first image signal or a first control signal transferred from the first driver 61 and operated according to a second image signal or a second control signal transferred from the second driver 62.

Hereinafter, a first connection pad 91' according to a modified embodiment will be described in detail with reference to FIGS. 4A and 4B.

Figure 4A:
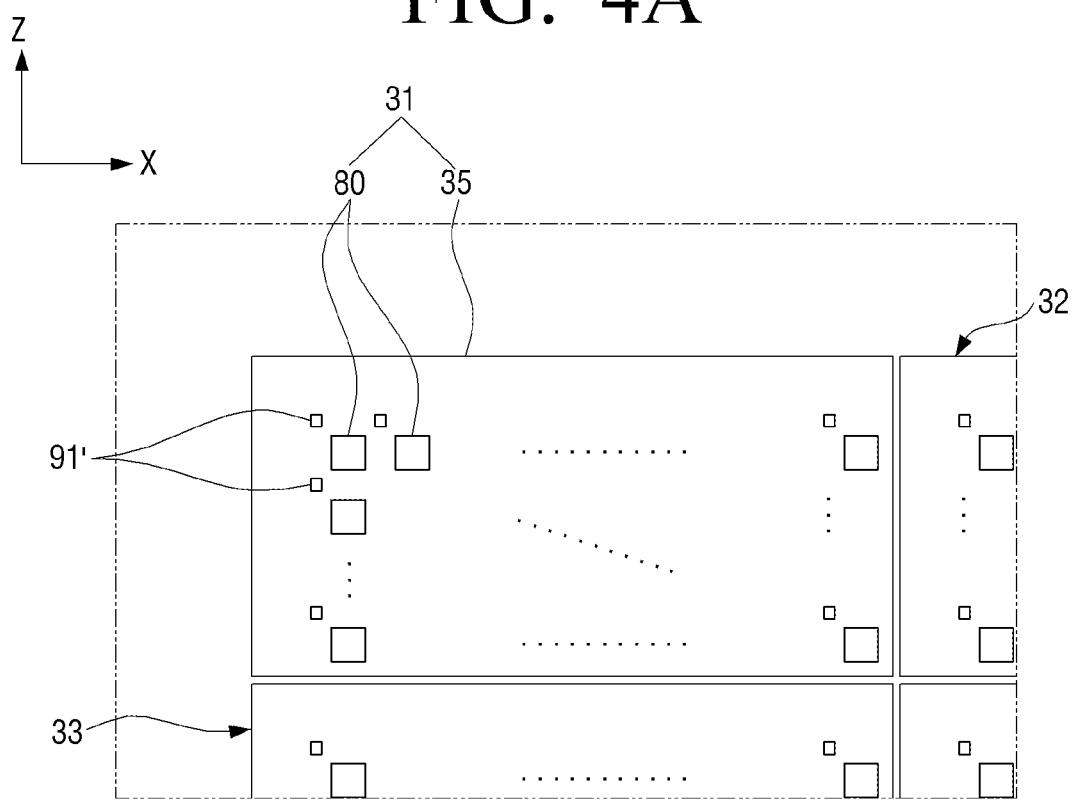
FIG. 4A shows an enlarged view illustrating display modules according to a modified embodiment of the disclosure.
Figure 4B:
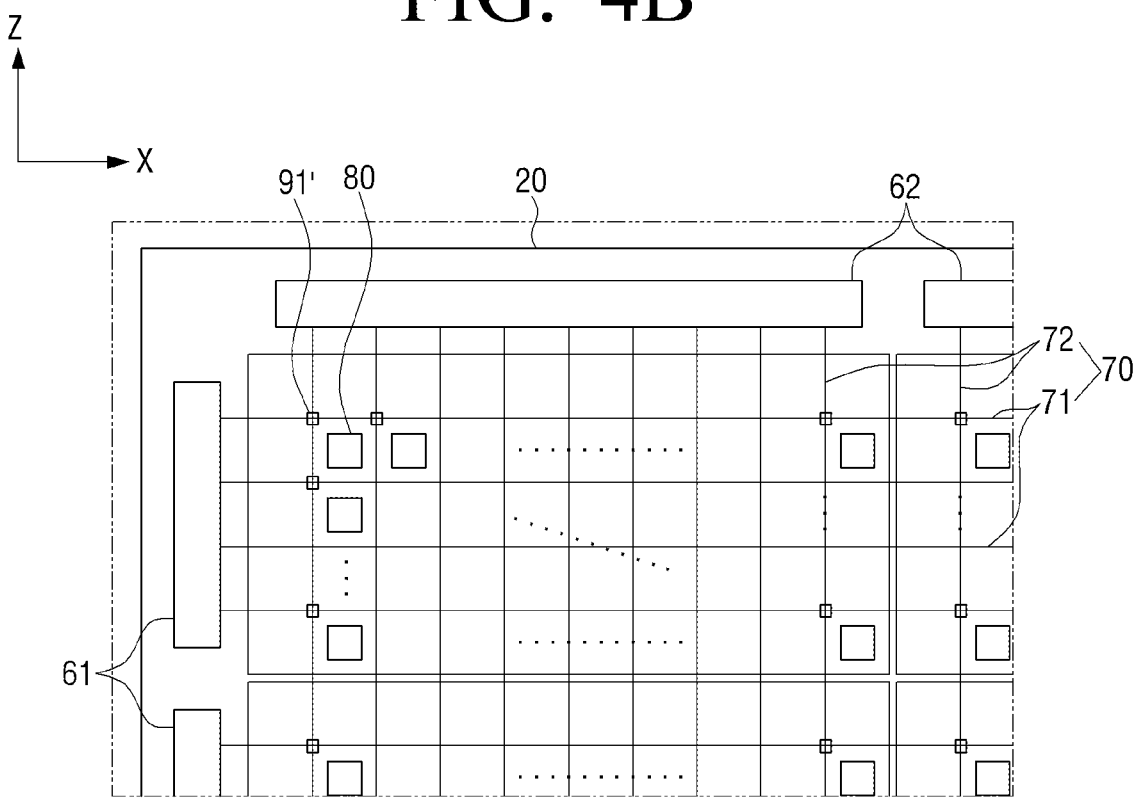
FIG. 4B shows an enlarged view illustrating a state in which the transparent plate and the display modules according to the modified embodiment of the disclosure are coupled to each other.
Figure 4C:
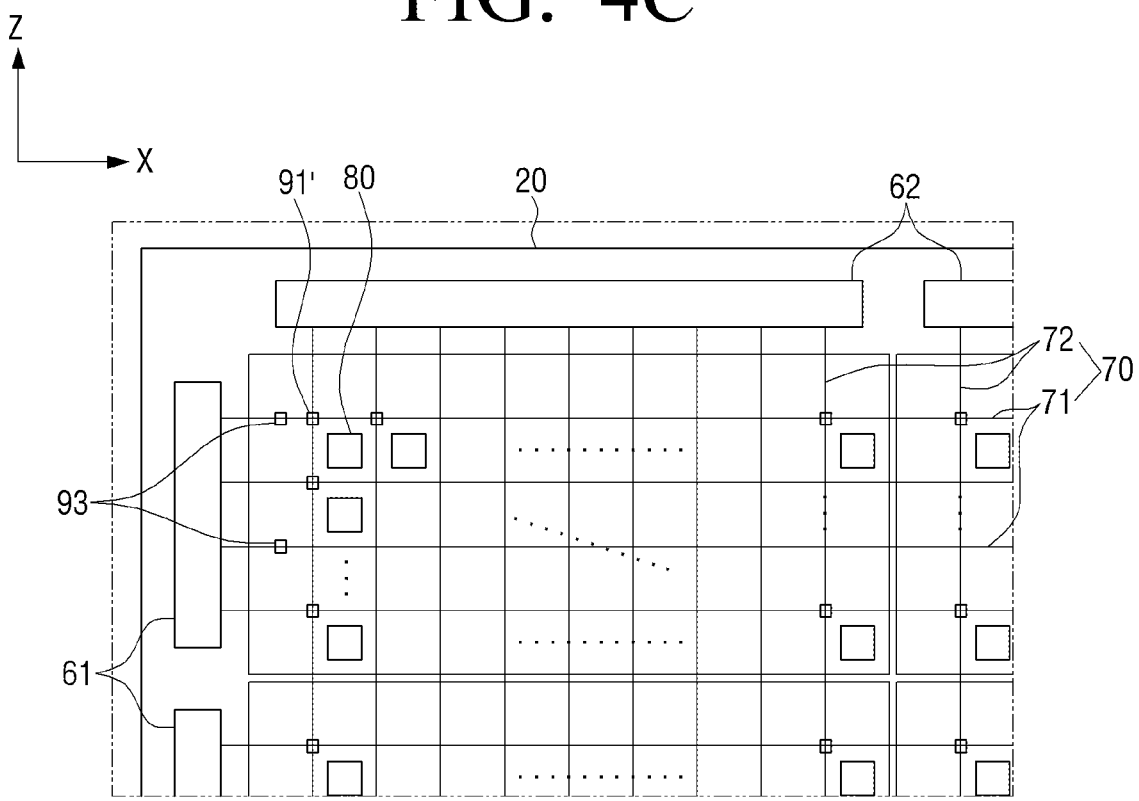
FIG. 4C shows an enlarged view illustrating display modules according to another modified embodiment of the disclosure.

FIG. 4A shows an enlarged view illustrating display modules 30 (e.g., all of display module 31, and part of display module 32) according to a modified embodiment of the disclosure, and FIG. 4B shows an enlarged view illustrating a state in which the transparent plate 20 and display modules 30 according to the modified embodiment of the disclosure are coupled to each other.

A transparent plate 20, a micro-LED 80, a connection wiring 70, and first and second drivers 61 and 62, which are denoted by the same reference numerals, have the same configurations as those described above, and thus an overlapping description will be omitted.

Unlike the first connection pad 91 including the horizontal-first connection pad 91a and the vertical-first connection pad 91b illustrated in FIGS. 3A and 3B, one first connection pad 91' illustrated in FIGS. 4A and 4B may be disposed diagonally to the micro-LED 80.

The first connection pad 91' may be formed by integrating the horizontal-first connection pad 91a and the vertical-first connection pad 91b illustrated in FIGS. 3A and 3B to each other.

As illustrated in FIG. 4B, the first connection pad 91' may be disposed diagonally to the micro-LED 80, such that the connection wiring 70 is not disposed on the micro-LED 80.

As a result, the connection wiring 70 may not block light emitted from the micro-LED 80, and may have a thickness larger than that of the connection wiring illustrated in FIG. 3A, thereby making it possible to reduce an electrical signal transfer resistance.

Further, a TFT substrate 35 may include an additional first connection pad 93 electrically connected to the plurality of micro-LEDs 80 and formed on an upper surface 35a of the TFT substrate 35.

In addition, the transparent plate 20 may include an additional second connection pad electrically connected to the additional first connection pad 93, and disposed on a lower surface 20b of the transparent plate 20.

Therefore, a signal for additionally controlling the plurality of micro-LEDs 80 may be transferred to the plurality of micro-LEDs 80 through the additional first connection pad and the additional second connection pad.

As a result, it is possible to variously control the plurality of micro-LEDs 80 and stably transmit a signal.

Positions where the additional first connection pad 93 and the additional second connection pad are not limited to those illustrated in the drawings, but may be diverse.

A method in which the additional first connection pad 93 and the additional second connection pad are connected to each other is the same as that in which the first connection pad 91 and the second connection pad 92 are connected to each other, and thus an overlapping description will be omitted.

Hereinafter, an operation of the display panel 40 according to the embodiment of the disclosure will be described with reference to FIG. 5.

Figure 5:
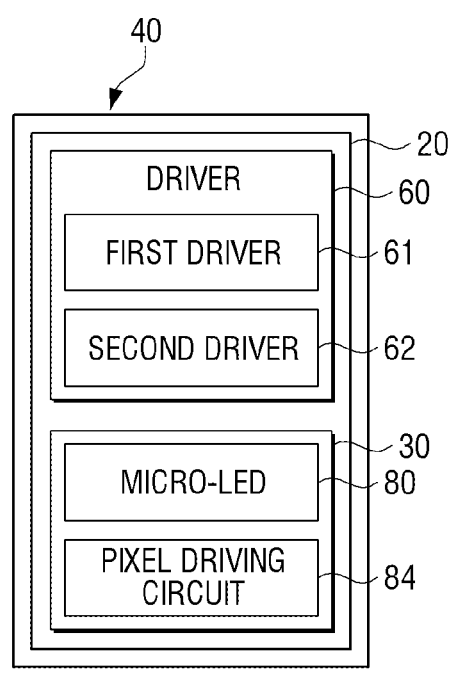
FIG. 5 shows a block diagram of a display apparatus according to an embodiment of the disclosure.

FIG. 5 is a block diagram of the display apparatus 1 according to the embodiment of the disclosure.

The display panel 40 may include the transparent plate 20 on which the driver(s) 60 (e.g., first driver 61 and second driver 62), which drives the display module may be disposed, and the display modules 30.

First, the driver(s) 60 may transfer, to the display modules 30, an image signal to be implemented in the display modules 30.

At this time, the signal transferred from the driver(s) 60 may be transferred to the micro-LED(s) 80, for example, the signal transferred from the driver(s) 60 may be transferred to the micro-LED(s) 80 through the driver connection pad 100, the connection wiring 70, the second connection pad 92, and the first connection pad 91, which may be sequentially.

Then, the respective display modules 30 may control the plurality of micro-LEDs 80 according to the image signal to output (display) an image.

Hereinafter, a specific structure of the display panel 40 will be described with reference to FIGS. 6 and 7.

Figure 7:
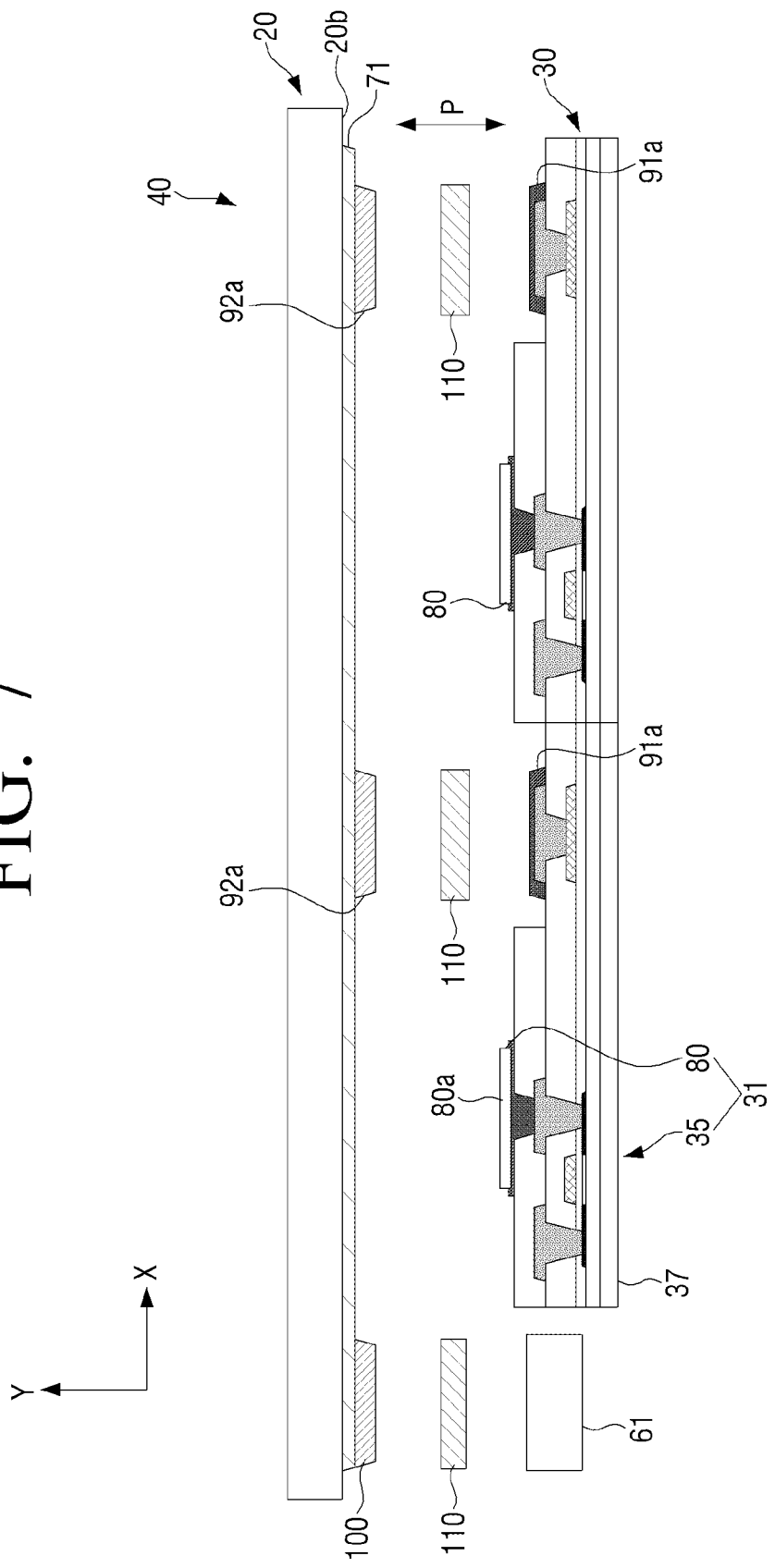
FIG. 7 shows an exploded cross-sectional view of FIG. 6.

FIG. 6 shows a cross-sectional view taken along line B-B of FIG. 3B, and FIG. 7 shows an exploded cross-sectional view of FIG. 6.

The plurality of display modules 31, 32, and 33, and the TFT substrates included in the plurality of display modules 31, 32, and 33 may be arranged at uniform intervals, and the plurality of display modules 31, 32, and 33, and the transparent plate 20 disposed on the plurality of display modules 31, 32, and 33 may be coupled to each other.

Specifically, the horizontal-second connection pad 92a disposed on the lower surface 20b of the transparent plate 20, and the horizontal-first connection pad 91a disposed on the upper surface of each of the display modules 31, 32, and 33 may be connected to each other through a conductive member 110 disposed between the horizontal-first connection pad 91a and the horizontal-second connection pad 92a.

Here, only the connection between the horizontal-first connection pad 91a and the horizontal-second connection pad 92a is described, but the vertical-first connection pad 91b and the vertical-second connection pad 92b may be connected to each other in the same manner or a similar manner.

That is, in general, the first connection pad 91 and the second connection pad 92 may be electrically connected to each other, and the conductive member 110 may be disposed between the first connection pad 91 and the second connection pad 92 to electrically connect the first connection pad 91 and the second connection pad 92 to each other.

The conductive member 110 may be a material having adhesiveness and conductivity, and may be an anisotropic conductive film (AFC) having conductivity only in a thickness direction.

In this way, the transparent plate 20 and the plurality of display modules 31, 32, and 33 may be connected to each other.

Further, the conductive member 110 may connect the driver connection pad 100 and the driver 60 to each other. The driver connection pad 100 and the driver 60 may be formed in the outer region of the transparent plate 20.

Accordingly, the driver 60 may be stably fixed in the outer region of the lower surface 20b of the transparent plate 20, and the image signal of the driver 60 may be transferred to the micro-LEDs 80.

Further, the micro-LEDs 80 may be disposed on the TFT substrate 35.

At this time, thicknesses and heights of the first and second connection pads 91 and 92, and the conductive member 110 may be adjusted so that an upper surface 80a of the micro-LED 80 is not in contact with the lower surface 20b of the transparent plate 20, or the connection wiring 70.

As shown in FIG. 6, a height h1 from the upper surface of the TFT substrate 35 to the transparent plate 20 may be larger than a height h2 from the upper surface of the TFT substrate 35 to the upper surface 80a of each of the plurality of micro-LEDs 80.

As a result, it is possible to prevent the plurality of micro-LEDs 80 from being damaged due to a contact between the plurality of micro-LEDs 80 and the transparent plate 20.

Figure 8:
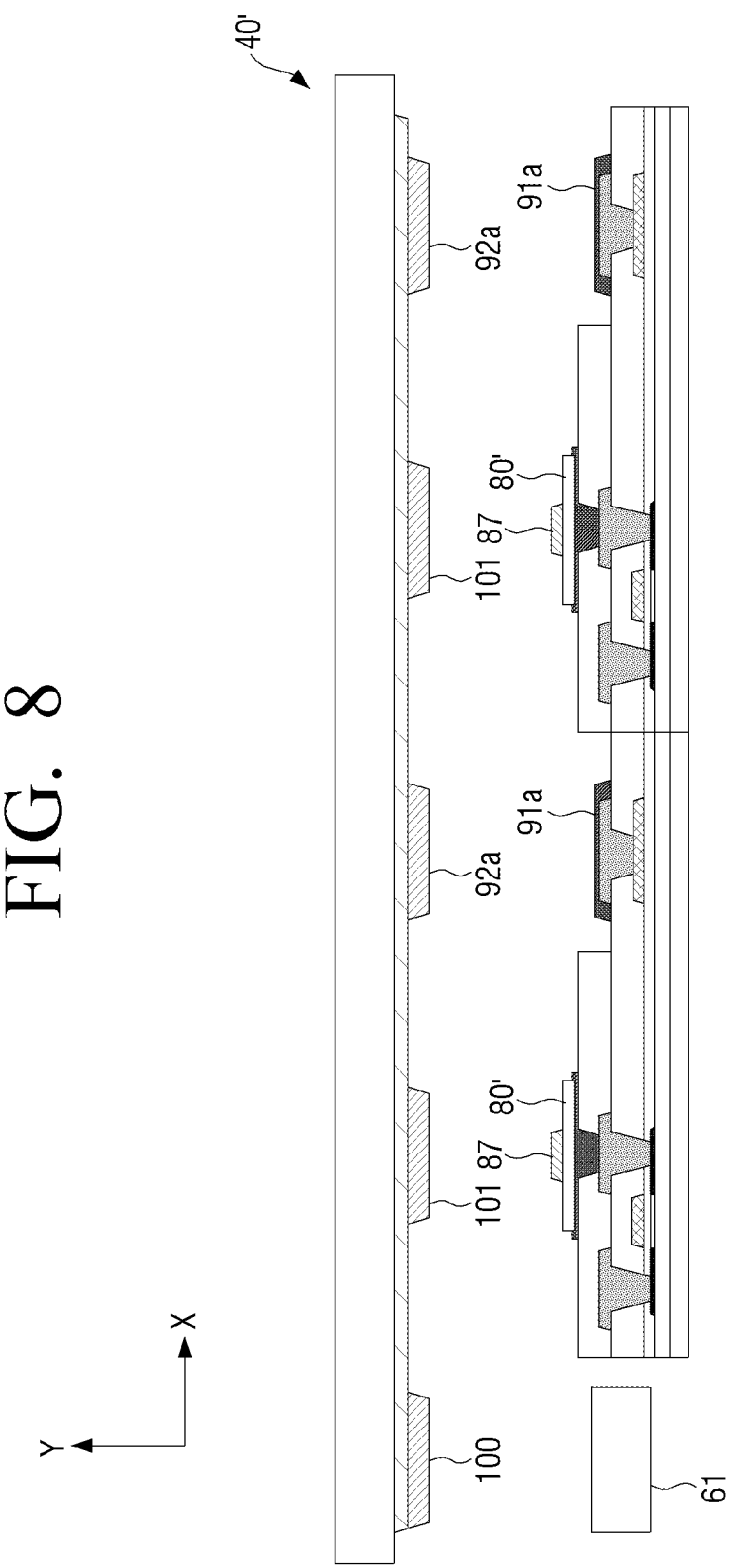
FIG. 8 shows an exploded cross-sectional view of a display panel according to a modified embodiment of the disclosure.

FIG. 8 shows an exploded cross-sectional view of a display panel 40' according to a modified embodiment of the disclosure.

A transparent plate 20, a connection wiring 70, first and second drivers 61 and 62, and first and second connection pads 91a and 92b, which are denoted by the same reference numerals, may have the same configurations as those described above, and thus an overlapping description will be omitted.

A micro-LED 80' may be a vertical type chip micro-LED. Therefore, an electrode of the micro-LED 80' may be electrically connected to an electrode pad 101 formed on a lower surface 20b of the transparent plate 20.

Therefore, the micro-LED 80' may be additionally coupled to the electrode pad 101 formed at a predetermined position, and thus a position of the micro-LED 80' may be fixed more stably.

Figure 9:
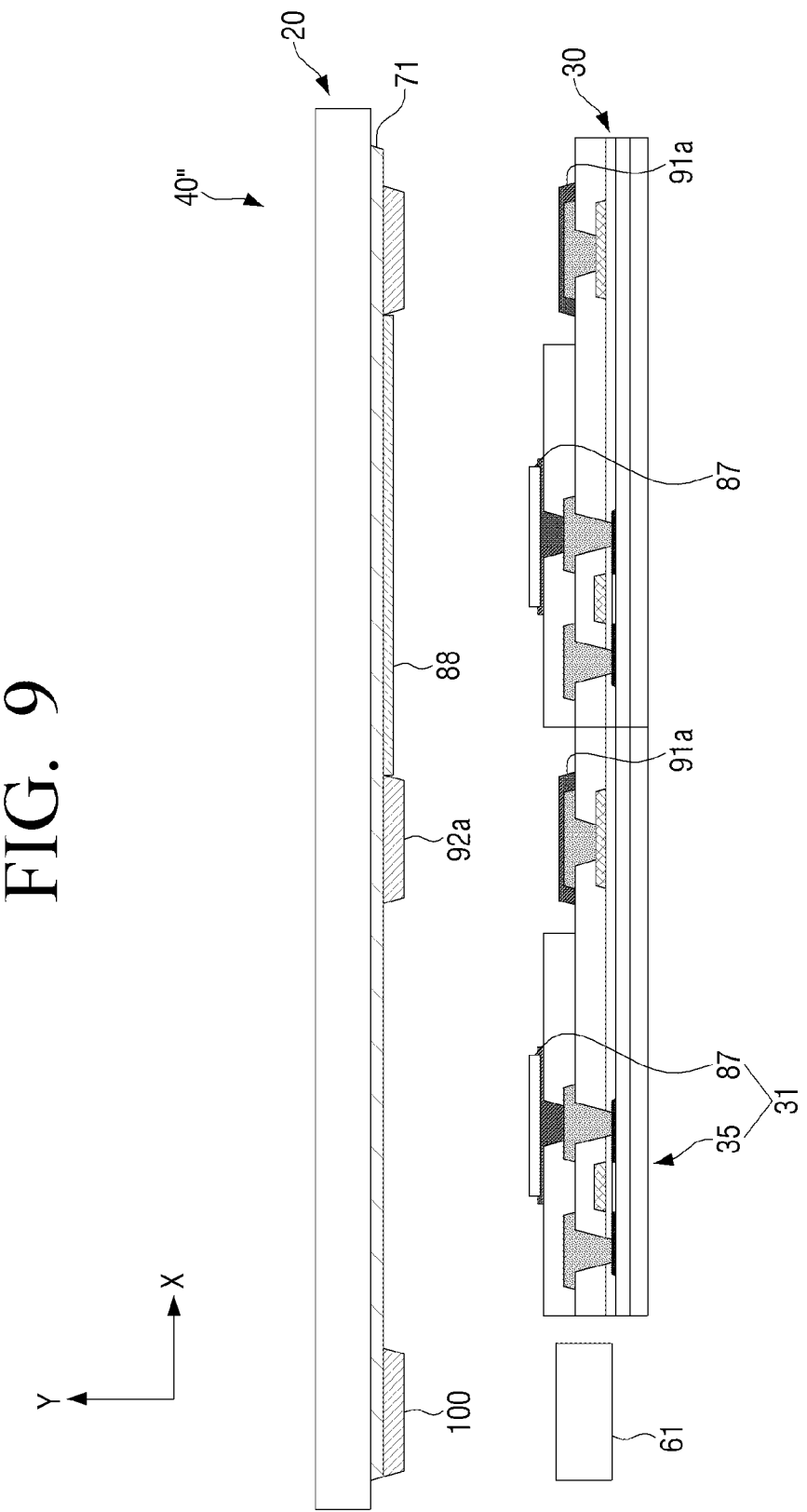
FIG. 9 shows an exploded cross-sectional view of a display panel according to another modified embodiment of the disclosure.

FIG. 9 shows an exploded cross-sectional view of a display panel 40" according to another modified embodiment of the disclosure.

A transparent plate 20, a connection wiring 70 (e.g., 71 and 72), first and second drivers 61 and 62, and first and second connection pads 91a and 92b, which are denoted by the same reference numerals, may have the same configurations as those described above, and thus an overlapping description will be omitted.

A micro-LED 87 may emit monochromatic light, and a plurality of micro-LEDs 87, which may be the same as each other, may be disposed on a TFT substrate 35.

For example, the micro-LED 87 may emit only one of red light, green light, and blue light.

Further, a color filter 88 may be disposed on a lower surface 20b of the transparent plate 20 positioned on or over one micro-LED 87.

By doing so, even in a case where the micro-LED 87 which emits monochromatic light is disposed, it is possible to implement various colors of the display panel 40" through the color filter 88.

As a result, it is possible to reduce the manufacturing costs and simplify the manufacturing process by disposing the micro-LEDs 87 which emit monochromatic light, in comparison to a case of sequentially disposing micro-LEDs which emit various colors of light.

Although the diverse embodiments of the disclosure have been individually described hereinabove, the respective embodiments are not necessarily implemented singly, but may also be implemented so that configurations and operations thereof are combined with those of one or more other embodiments.

Although the embodiments of the disclosure have been illustrated and described hereinabove, the disclosure is not limited to the abovementioned specific embodiments, but may be variously modified by those skilled in the art to which the disclosure pertains without departing from the scope and spirit of the disclosure as disclosed in the accompanying claims. These modifications should also be understood to fall within the scope of the disclosure.

What is claimed is:

1. A display panel comprising:
   a plurality of light emitting diodes (LEDs);
   a thin film transistor (TFT) substrate comprising first connection pads, wherein
      the plurality of LEDs are disposed in a first region of an upper surface of the TFT substrate,
      the first connection pads disposed on the upper surface of the TFT substrate, and
      the first connection pads are electrically connected to the plurality of LEDs;
   a transparent plate disposed on the TFT substrate, wherein
      the transparent plate comprises second connection pads,
      the second connection pads are disposed on a lower surface of the transparent plate and are electrically connected to the first connection pads, and
      the lower surface of the transparent plate faces the upper surface of the TFT substrate; and
   a driver electrically connected to the second connection pads and disposed in an outer edge region of the transparent plate.

2. The display panel as claimed in claim 1, wherein a surface area of the transparent plate is larger than a surface area of the TFT substrate, and the driver is disposed on the lower surface of the transparent plate in an area that does not overlap with the surface area of the TFT substrate.

3. The display panel as claimed in claim 1, wherein a number of first connection pads equals a number of second connection pads, and the second connection pads are disposed at a position facing the first connection pads.

4. The display panel as claimed in claim 3, further comprising:
   a conductive member disposed between a first connection pad and a second connection pad, the conductive member electrically connecting the first connection pad and the second connection pad to each other, wherein a height or distance from the upper surface of the TFT substrate to the transparent plate is larger than a height or distance from the upper surface of the TFT substrate to an upper surface of each of the plurality of LEDs.

5. The display panel as claimed in claim 1, wherein
   the transparent plate further includes a connection wiring that electrically connects the second connection pads and the driver to each other and that is formed in a matrix form, and
   the connection wiring is formed on the lower surface of the transparent plate.

6. The display panel as claimed in claim 5, wherein the connection wiring includes a first connection wiring formed in a horizontal direction, and a second connection wiring formed in a vertical direction, and at least one second connection pad is disposed in a region in which the first connection wiring and the second connection wiring intersect with each other.

7. The display panel as claimed in claim 6, wherein the driver includes a first driver electrically connected to the first connection wiring and disposed with a length in the horizontal direction of the transparent plate, and a second driver electrically connected to the second connection wiring and disposed with a length in the vertical direction of the transparent plate.

8. The display panel as claimed in claim 1, wherein the TFT substrate further includes an additional first connection pad electrically connected to the plurality of LEDs and disposed on the upper surface of the TFT substrate, and the transparent plate further includes an additional second connection pad electrically connected to the additional first connection pad and disposed on the lower surface of the transparent plate.

9. The display panel as claimed in claim 1, wherein each of the first connection pads is disposed adjacent to one of the plurality of LEDs so that the first connection pads correspond one-to-one to the plurality of LEDs.

10. A display apparatus comprising:
a plurality of display modules;
a transparent plate disposed on the plurality of display modules and electrically connected to the plurality of display modules; and
a housing configured to fix the plurality of display modules and the transparent plate to each other, wherein
each of the plurality of display modules includes a thin film transistor (TFT) substrate, a plurality of LEDs disposed in a predetermined region of an upper surface of the TFT substrate, and a first connection pad disposed on the upper surface of the TFT substrate and electrically connected to the plurality of LEDs,
the transparent plate includes a second connection pad disposed on a lower surface of the transparent plate and electrically connected to the first connection pad,
the lower surface of the transparent plate faces the upper surface of the TFT substrate, and
the display apparatus further comprises a driver electrically connected to the second connection pad, the driver being disposed in an outer region of the transparent plate, and configured to drive the plurality of LEDs.

11. The display apparatus as claimed in claim 10, wherein a plurality of TFT substrates are arranged parallel to each other on a same plane, and an area of the transparent plate is larger than a sum of areas of the plurality of TFT substrates.

12. The display apparatus as claimed in claim 11, wherein the plurality of TFT substrates are arranged on the lower surface of the transparent plate.

13. The display apparatus as claimed in claim 12, wherein distances from the lower surface of the transparent plate to upper surfaces of the plurality of LEDs are uniform.

14. The display apparatus as claimed in claim 10, wherein the driver is disposed on the lower surface of the transparent plate.

15. The display apparatus as claimed in claim 10, wherein a number of first connection pads equals a number of second connection pads, and at least one second connection pad is disposed at a position facing at least one first connection pad.

16. A display panel comprising:
a plurality of micro-light emitting diodes (LEDs);
a thin film transistor (TFT) substrate, wherein the plurality of micro-LEDs are disposed on an upper surface of the TFT substrate;
a transparent plate disposed on the TFT substrate, wherein a lower surface of the transparent plate faces the upper surface of the TFT substrate; and
a first driver and a second driver, wherein
the first and second drivers are electrically connected to the plurality of micro-LEDs through first and second connection pads, respectively, and first and second connection wirings, respectively,
the first and second drivers are disposed in an outer region of the transparent plate adjacent to a thin film transistor (TFT), and
the first and second connection wirings intersect.

17. The display panel as claimed in claim 16, further comprising at least one connection wiring that connects the first and second drivers to the plurality of micro-LEDs and transmits a signal which causes the plurality of micro-LEDs to illuminate.

18. The display panel as claimed in claim 17, wherein the at least one connection wiring is at least one of: formed of a transparent material that does not block light emitted from the plurality of micro-LEDs, or has a thickness or diameter that is small enough to not block the light emitted from the plurality of micro-LEDs.

19. The display panel as claimed in claim 16, further comprising one or more connections pads formed on the upper surface of the TFT substrate adjacent to the plurality of micro-LEDs to correspond to the plurality of micro-LEDs.

* * * * *